US009604259B2

(12) United States Patent
Lossov et al.

(10) Patent No.: US 9,604,259 B2
(45) Date of Patent: Mar. 28, 2017

(54) MODULAR PARCEL TERMINAL AND METHOD FOR SENDING PARCELS

(71) Applicant: Cleveron Ltd, Viljandi (EE)

(72) Inventors: Remi Lossov, Viljandi (EE); Lauri Hirvesaar, Tallinn (EE); Indrek Pettai, Intsu kula (EE)

(73) Assignee: Cleveron Ltd, Viljandi (EE)

( * ) Notice: Subject to any disclaimer, the term of this patent is extended or adjusted under 35 U.S.C. 154(b) by 0 days.

(21) Appl. No.: 14/565,518

(22) Filed: Dec. 10, 2014

(65) Prior Publication Data

US 2015/0343494 A1  Dec. 3, 2015

(30) Foreign Application Priority Data

May 30, 2014 (EP) ..................................... 14170713
Jul. 21, 2014 (EP) ..................................... 14177916

(51) Int. Cl.
| B07C 7/02 | (2006.01) |
| H05K 5/02 | (2006.01) |
| A47F 10/02 | (2006.01) |
| G07F 17/12 | (2006.01) |
| A47G 29/14 | (2006.01) |

(52) U.S. Cl.
CPC ................ *B07C 7/02* (2013.01); *A47F 10/02* (2013.01); *G07F 17/12* (2013.01); *H05K 5/0221* (2013.01); *A47G 2029/145* (2013.01); *A47G 2029/149* (2013.01)

(58) Field of Classification Search
USPC .................... 235/375; 705/26.9; 70/283, 277
See application file for complete search history.

(56) References Cited

U.S. PATENT DOCUMENTS

| 6,336,691 | B1 * | 1/2002 | Maroney | H05K 7/20127 312/213 |
| 7,494,012 | B1 * | 2/2009 | Priebe | A61J 1/03 206/1.5 |
| 9,081,886 | B2 * | 7/2015 | Schifman | G07F 11/62 |
| 2004/0144328 | A1 * | 7/2004 | Bonner | A01K 1/03 119/455 |
| 2006/0181392 | A1 * | 8/2006 | Watson | E05B 35/12 340/5.73 |
| 2012/0078413 | A1 * | 3/2012 | Baker, Jr. | G07F 17/12 700/232 |

(Continued)

FOREIGN PATENT DOCUMENTS

| GB | 2437967 A | 11/2007 |
| WO | 2009148388 A1 | 12/2009 |

*Primary Examiner* — Allyson Trail
(74) *Attorney, Agent, or Firm* — Berggren Inc.

(57) ABSTRACT

The modular parcel terminal according to the present invention has been built from modules comprising outward moving open-topped compartments and compartments with doors and the console module. The outward moving open-topped compartments have been located in the parcel terminal in such a pattern that would allow achieving the maximum capacity of the parcel terminal and that it would be comfortable and safe for the user to enter and retrieve parcels, postal packages, storable items at the parcel terminal. The modules of the parcel terminal have been built in such a way that allows them to be connected with each other according to the need of storage space in a particular parcel terminal exploitation area.

9 Claims, 6 Drawing Sheets

(56) References Cited

U.S. PATENT DOCUMENTS

| | | | |
|---|---|---|---|
| 2012/0305428 A1* | 12/2012 | Bouhraoua | B65D 43/167 |
| | | | 206/438 |
| 2012/0326840 A1 | 12/2012 | Frankenberg et al. | |
| 2013/0073428 A1* | 3/2013 | Thramann | G06Q 10/083 |
| | | | 705/26.9 |
| 2014/0225491 A1* | 8/2014 | Shoenfeld | A47B 81/00 |
| | | | 312/237 |
| 2015/0091429 A1* | 4/2015 | Kruse | A47B 88/14 |
| | | | 312/334.33 |
| 2015/0302351 A1* | 10/2015 | Cassady | B65G 1/137 |
| | | | 705/339 |

* cited by examiner

MODULAR PARCEL TERMINAL AND METHOD FOR SENDING PARCELS

PRIORITY

This application claims priority of European application EP14170713 filed on May 30, 2014 and of European application EP 1477916 filed on Jul. 7, 2014, and the contents of both of which are fully incorporated herein by reference.

FIELD OF THE INVENTION

The present invention relates to the field of self-service parcel terminals, more specifically to the field of delivery, sending and receiving parcels, packages, mail and other postal objects.

BACKGROUND OF THE INVENTION

From the level of technology it is known of several different automated parcel sending devices and terminals. Widely known are the package or parcel terminals that have a locker with a separate door for each postal object or storage item. Such widely known solutions have several drawbacks.

The generally known parcel terminal solutions are of the kind where they have been placed in a long row alongside a wall, with their backs against each other or they have been built from modules that allow the parcel terminals to be placed in the Γ or Π shape into the corners of the rooms. There are lockers with doors of different sizes corresponding to the parcels of different sizes. In the case of different senders and recipients it is preferred to use separate lockers for each parcel, which is why the terminals are too big and space-consuming in order to accommodate enough parcels. For example, it is expensive to use the services of parcel terminals in the shopping and entertainment centers, sports centers, airports, etc. where there is little floor space and the rental space is expensive. However, the parcel terminals cannot, at the same time, be built higher because shorter people or people in wheelchairs would not be able to retrieve postal objects from higher lockers, or place packages there. Similarly, in the case of smaller packages, it is complicated for users to get them from lower or higher lockers.

Although the generally known parcel terminals have lockers of different sizes, in the case of small parcels (for example, letters, books, essentials, pens, goods from e-shops, etc.) only a small proportion of the space on the locker has been used and most space in the lockers remains unoccupied. Although there are lockers of smaller height for storing or sending smaller parcels, however, they are inconvenient to use because due to the depth of the space, the parcel may, upon sending, move to the back wall and therefore it is complicated to retrieve that parcel.

Widely known parcel terminals are thus of smaller storage capacity, take up too much space, are inconvenient for the user while entering small-sized packages, letters and other items for storage or sending, and upon retrieving. The generally known solutions have used doors, which is why it is complicated to retrieve items when they have been placed further inside the locker space. It is also complicated to retrieve or take out smaller items from higher lockers. Such wide-spread generally known solutions are offered by such manufacturers as, for example, DHL, KEBA, UPS, Amazon Locker and others. Examples of solutions of such widely known parcel terminals of lockers with doors could be, for example, the solutions described in patent applications WO2009148388 (COMBIPLATE AB), 10.12.2009 and US2012326840 (DEUTSCHE POST AG), 27.12.2012.

The closest solution to the present invention could be considered the patent application GB2437967 (BYBOX HOLDINGS LTD), 14.11.2007 which describes an alternative version of a parcel terminal with an automated locking system fitted with a sensor, electronic controller and lock; and according to which the parcel terminal uses large drawers, instead of lockers with doors, that involve a moving back panel. In the case of an empty drawer, in the closed position of the drawer, the back panel has been moved forward against the front panel of the drawer. Upon opening the drawer, the drawer together with the front panel moves forward and the back panel of the drawer remains in the same position as in the closed position of the drawer, creating space into the drawer for placing items into. Upon closing the drawer where a parcel or an item to be stored has been placed into, the back panel moves into the inside or the parcel terminal together with the drawer. The purpose of the given solution is to offer an automated parcel storage terminal most suitable for using in public places, wishing to decrease the problem with it where, in a public location, a small child or an animal might enter an unattended automated locker and get trapped in there. That kind of solution also aims at reducing the problem where, in public places, explosive substances or other illicit items might get into an unattended open locker before it is closed. These problems have been solved in the given solution with a moving internal wall of the terminal that moves forward in the terminal against the door of the locker or against the front panel of the drawer upon opening the locker, thus reducing the risk that something unwanted might get inside the terminal. The drawback of such a solution is that most of the space in the terminal or drawer, in the case of smaller packages or stored items, has been left unused. As it is statistically known that people tend to send smaller packages more often, then in such an automated terminal, with the lockers empty for the most part, most of the automated terminal space is unused which makes the cost per terminal very big; or, when it is a location with lots of users, more terminals must be added which, in its turn increases the cost. Another drawback of such a solution is its uncomfortable usage since the courier, the recipient or sender of the package and also the person storing items has problems retrieving parcels from the highest or lowest lockers because it is not clearly visible where the parcel is located and/or it is hard to reach the parcel, or it is necessary to stretch hands deep into the locker.

In addition to the known solutions there is also a problem with the situation of receiving bigger parcels where the measures of the cross sections of the parcel are approximately the same as the measures of the locker and the parcel has tightly been pushed into the locker. By trying to get their fingers between the parcel and the locker walls, the users may injure themselves or damage the parcel.

Furthermore, the solution described in the patent application GB2437967, or other known solutions depending on the location of the parcel terminal, season and the habits of the users does not enable the possibility to offer users more versatile usage options with terminals with a suitable size and number of lockers. It is generally known that depending on the location of the terminal (for example airport, shopping center, sports centers, big complexes of apartment buildings, offices, etc.), and the time (for example Christmas and other important days or events), the users have habits to send parcels of different types and sizes.

SUMMARY OF THE INVENTION

The aim of the present invention is to offer a solution of a modular parcel terminal that would be free from the previously mentioned drawbacks, safe, simple, fast, reliable, capacious and taking up little floor space that would enable accommodating as many parcels, postal packages, storable items, etc. as possible into one parcel terminal.

Solving the problems stated above, and the aim of the invention have been achieved with a modular parcel terminal that comprises, differently from the compartments with doors used in the solutions so far, open-topped compartments that have been located inside the parcel terminal in order to achieve the maximum capacity of the parcel terminal, and that it would be comfortable and safe for the users to enter parcels, postal packages, storable items into the parcel terminal as well as retrieve them from the terminal. The modules of the parcel terminal have been compiled so that they can be connected to each other according to needs, how much storage space is necessary in that particular usage location of the parcel terminal. For example, when usage activity increases in a given area, it is possible to add modules to the terminal, or, if the usage activity decreases, it is possible to remove modules according to specific needs.

As the floor space is often limited in the usage locations of the parcel terminal, or renting the floor space is quite expensive, then in order to achieve the maximum capacity of the parcel terminal and making it take as little space as possible, guaranteeing at the same time convenient usage as well as safety, the compartments of the parcel terminal have been constructed in a way that takes into consideration the sizes of the parcels most typically sent or stored. Due to this, the compartments for bigger parcels are located high and low in the parcel terminal, and the compartments for small packages that are most common items to be sent, are located on the level that is most convenient for the users to use. Users prefer to enter parcels into the terminal and retrieve them from the parcel terminal at the height that would be conveniently reachable.

Due to the construction of the compartments, the solution according to the present invention allows, differently from the solutions known thus far, more comfortable and safer use by shorter people and people in wheelchairs.

The users can, differently from the solutions known so far, retrieve smaller parcels from the parcel terminal and enter their parcels much more easily and conveniently thanks to the moving compartments. In order to retrieve or enter the package, the moving compartment automatically opens forward and since the moving compartment is open-topped, independent of the position of the parcel in the compartment, it is comfortable for the user to take it out, or to enter it into the compartment because it is not necessary to push hand inside the compartment; whereas the position of the parcel in the compartment is well visible for the user.

Thanks to the moving compartments it is possible to make significantly narrower modules, compared to the width of the doors of the compartments known from the level of technology, where compartments are meant for smaller parcels.

Pulling the drawers out is limited and it is impossible to take them out before removing the locking system. Removing the drawers from a working (online) module is out of the question, it can only be done by the maintenance person upon opening (removing) the locking system that prevents pulling out the drawers.

The modular parcel terminal according to the present invention comprises a console module. Console module also comprises an electronics system comprising, if necessary, a printer, scanner, payment solution, screen or touch-screen and/or other electronic devices in order to identify the user, make payments and/or orders, and moving compartments to achieve the maximum capacity of the parcel terminal.

In an alternative embodiment, the console module comes as a module without compartments in order to enable adding other devices to the parcel terminal according to its usage needs.

As statistics claim that only ⅙ of the whole space of the smallest compartment is used purposefully, then an additional aim of the present invention is to optimize the usable space and the compartments with doors have been replaced with open-topped moving compartments that accommodate smaller parcels, for example, letters, smaller books, pens, essentials, cosmetic products or other items that take up very little space in the widely known solutions featuring compartments with doors thus making the managing costs high because most of the space in the parcel terminal remains unused.

The solution according to the present invention also enables, in different embodiments, the usage of narrower compartments for small parcels compared to what has so far been used in the thus far known solutions of locker compartments with doors.

BRIEF DESCRIPTION OF THE DRAWINGS

The present invention is explained more precisely with references to figures added, where.

DETAILED DESCRIPTION OF THE INVENTION

The modular parcel terminal according to the present invention has been built from modules comprising outward moving open-topped compartments and compartments with doors 16 and a console module that comprises the electronics system 19.

The module of the modular parcel terminal according to the present invention comprises a rear panel 1, side walls 2, cable conduit 3, sections comprising compartments with doors 16 and moving compartments and comprises wires/cables, locking devices and hinges for doors 16, support wheels for rails 4, locking and moving mechanism 7 for moving compartments, locking system 8 preventing pulling out the compartment and electronics system 19 comprising cables, a computer, printer, camera, touchpad, screen or touch screen, scanner and/or other electronic devices for identifying the user, making payments and/or placing orders.

The outward moving compartment comprises a bottom 9, the edges of which have been bent into sides 10 and the edges of the sides have been bent into rails 11, front panel 12, the rear wall of the compartment 13, reinforcement panels 14, the strike plate/receiver 15 of the locking mechanism fastened to the rear panel of the compartment.

The compartment with doors comprises walls that have been formed from the side walls 2 of the, rear panel which has been formed from the rear panel 1 of the module, doors 16 and partition panels 17 that form the lower and upper parts of the compartment with doors 16, whereas the lower part of the topmost compartment with door 16 is at the same time the upper part for the compartment with door 16 underneath it, and the upper part of the lowest compartment with door 16 forms the bottom part for the next compartment with door 16. In the case where more compartments with doors 16 have been compiled in the module, the partition panels 17 form the bottom and upper parts for the compartments with doors 16 respectively.

There are support wheels 4 attached to the side walls 2 of the module to support the rails 11 for moving compartments. The rear panel 13 of the moving compartment has been moved forward up to the point that in the closed position of the moving compartment there is minimal space between the rear panel 13 of the moving compartment and the rear panel 1 of the parcel terminal for cables and locking as well as moving mechanisms 3 for the moving compartments, whereas rollers 18 have been attached to the rear ends of the sides 10 of the compartment to move the compartment.

That guarantees maximum capacity within the depth of the whole parcel compartment, and allows opening the compartment to its maximum.

There is a partition panel 5 added between moving compartments in order to separate the parcel placed inside the compartment from the upper compartment. The partition panel 5 does not allow soft parcels and/or parcels of irregular shape get into the moving area of the upper compartment, and does not stop the movement of the upper compartment.

The fastening places, in the module, of the side walls 2 for the support wheels 4 of the rails of the compartments and for fastening the partition panels 17 for compartments with doors have been made at such spacing that the height of each compartment with door 16 corresponds to the height of at least two outward moving compartments. That guarantees maximum capacity of the parcel terminal and allows replacing the compartments with doors fast with outward moving compartments or the other way round when needs change in the exploitation area of the parcel terminal and it is necessary to send or store more of smaller parcels and items, or larger parcel and other items.

The upper and lower sections of the module are preferably the compartment with door 16, since it is complicated to enter and retrieve parcels, especially small ones, at such low and high locations. In order to make it as comfortable as possible for the user to enter and retrieve especially smaller parcels or other items, the sections of the module within the limits convenient for the user have been built as moving open-topped compartments. Entering and retrieving a parcel in the case of known solutions have been depicted in the drawing FIG. 8*a*, and the same act in the case of the solution according to the present invention has been depicted in the drawing FIG. 8*b*.

In addition, the module comprises electronic locking system that is run by the computer through relevant software that has been placed in the electronics system 19 of the console. Upon identifying the user, the compartment is opened. The user sees the open compartment and can enter their parcel or retrieve it. The module comprises the locking system 8 that prevents pulling out the compartments, so that the user would not be able to remove the moving compartment in its open position.

The various open positions of several outward moving compartments depicted in drawings FIG. 1*a* to FIG. 3 are illustrative. One compartment will open in the preferable embodiment of the invention. The alternative embodiment of the invention allows opening several compartments if needed, for example, if it is necessary to send several parcels to the same recipient and they do not fit into one compartment, or when one person sends parcels to several recipients at the same time.

Figure 1A:
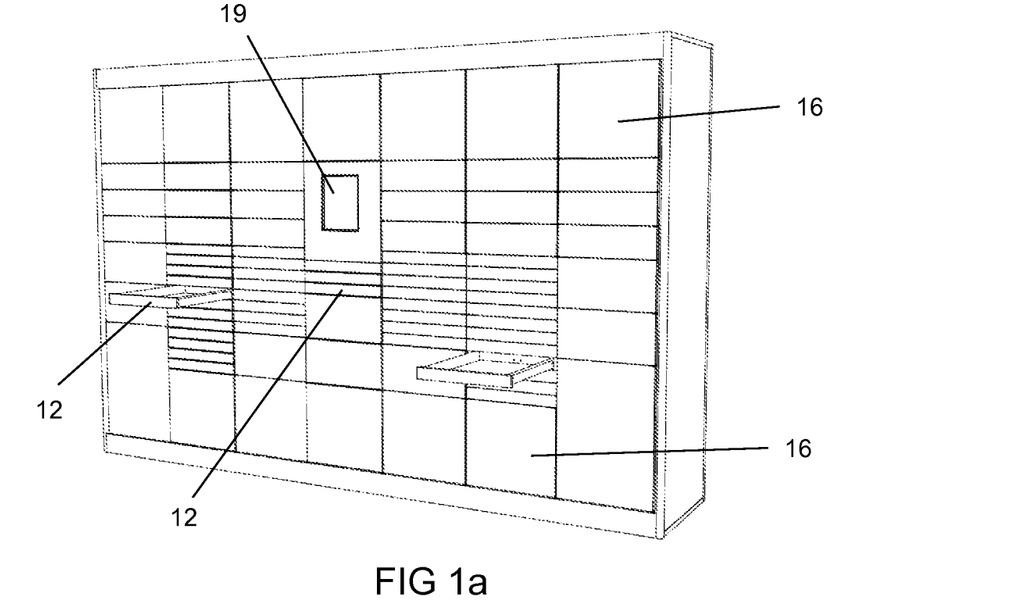
FIG. 1a shows a perspective view of the modular parcel terminal in a preferable embodiment with open-topped compartments.

The drawing FIG. 1*a* shows a perspective view of the modular parcel terminal according to the present invention in a preferable embodiment depicting the outward moving compartment in its open position. The electronics system 19 of the console module has compartments added above and below, in the preferable embodiment of the invention. The outward moving compartments have been added, preferably due to the suitable height of the screen and other devices of the electronics system, under the electronics system, with at least one compartment with door 16; and at least one compartment with door 16 has been added above the electronics system 19. Such embodiment enables maximum use of the space of the parcel terminal and guarantees the biggest capacity.

Figure 1B:
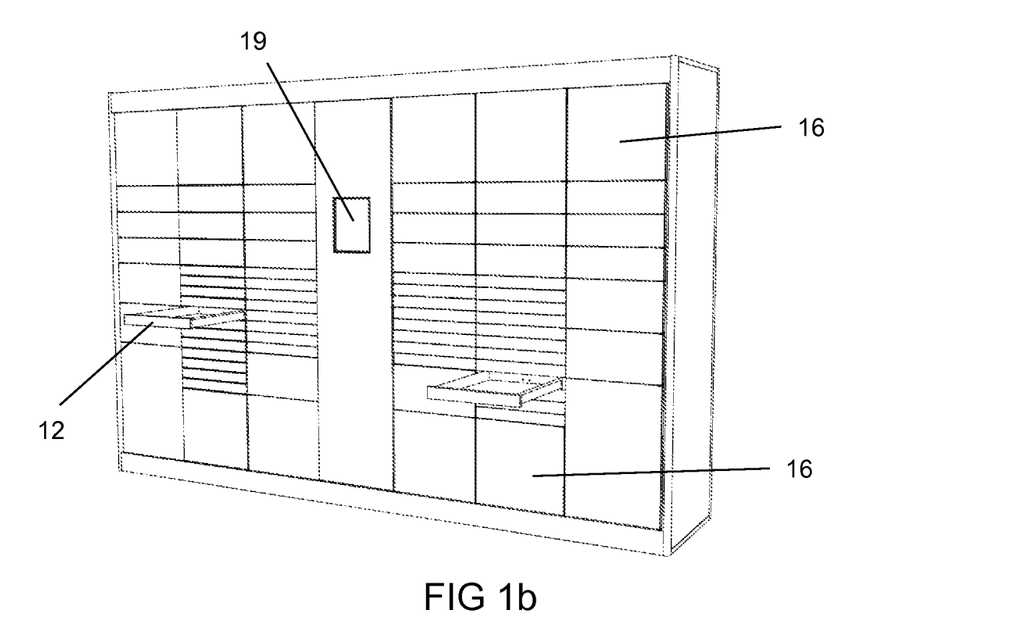
FIG. 1b shows a perspective view of the modular parcel terminal in one alternative embodiment with open-topped compartments.

The alternative embodiment of the invention shown in the drawing FIG. 1*b* is without compartments due to its bigger capacity for components of the electronics system 19 of the console module (for example various devices for identifying the user, devices for placing orders and/or making payments, batteries, etc.).

All of the modules of the parcel terminal in the third embodiment of the present invention are with outward moving compartments, or with outward moving compartments and the location of the compartments with doors 16 has been built according to the special needs of the users and/or according to the special requirements set by the parcel terminal area of exploitation. For example, more outward moving compartments have been added higher up from or lower than the center of the parcel terminal, or the modules with outward moving compartments and with doors have been built in alternated pattern.

Figure 2A:
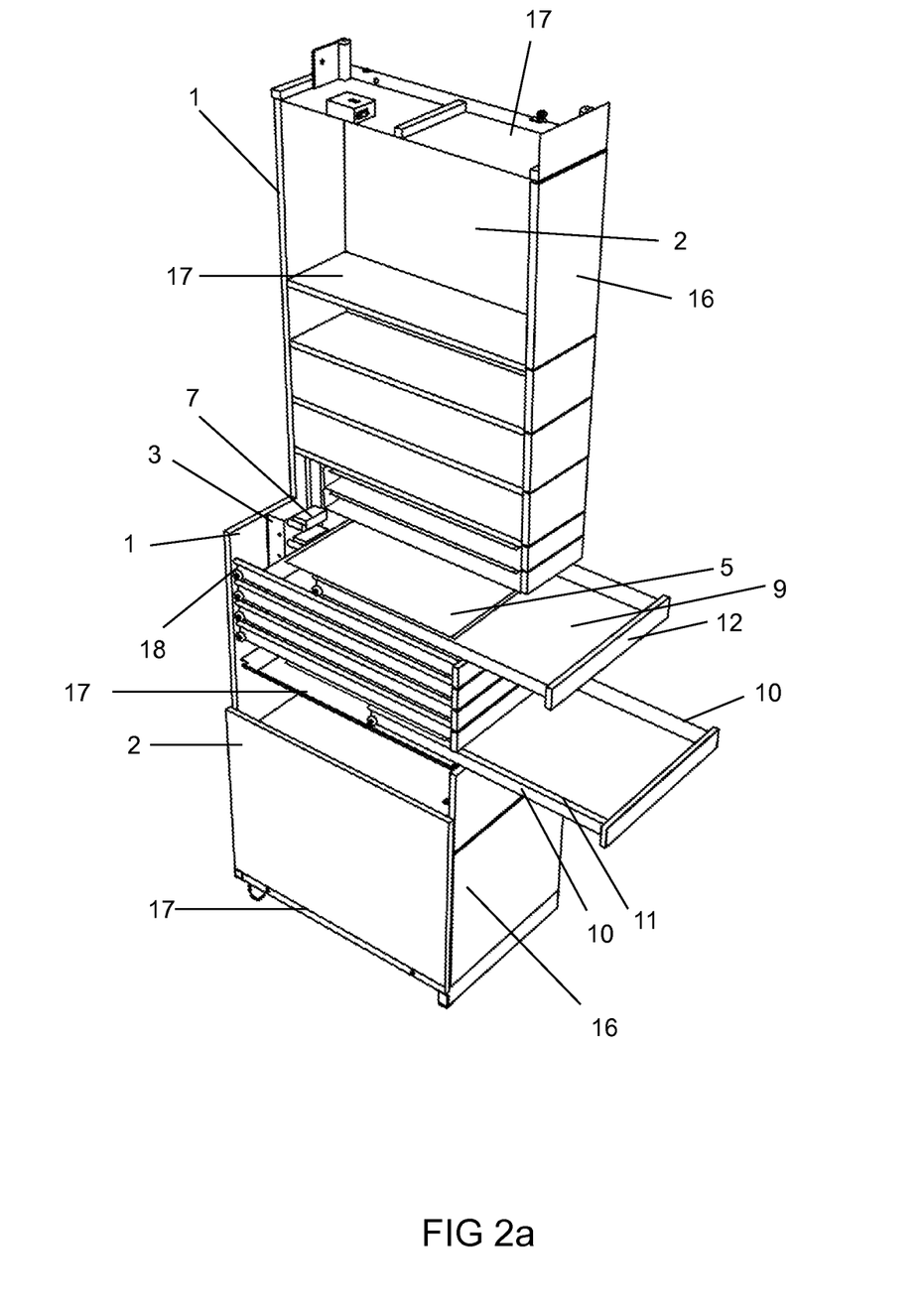
FIG. 2a shows a perspective view of the modular parcel terminal.
Figure 2B:
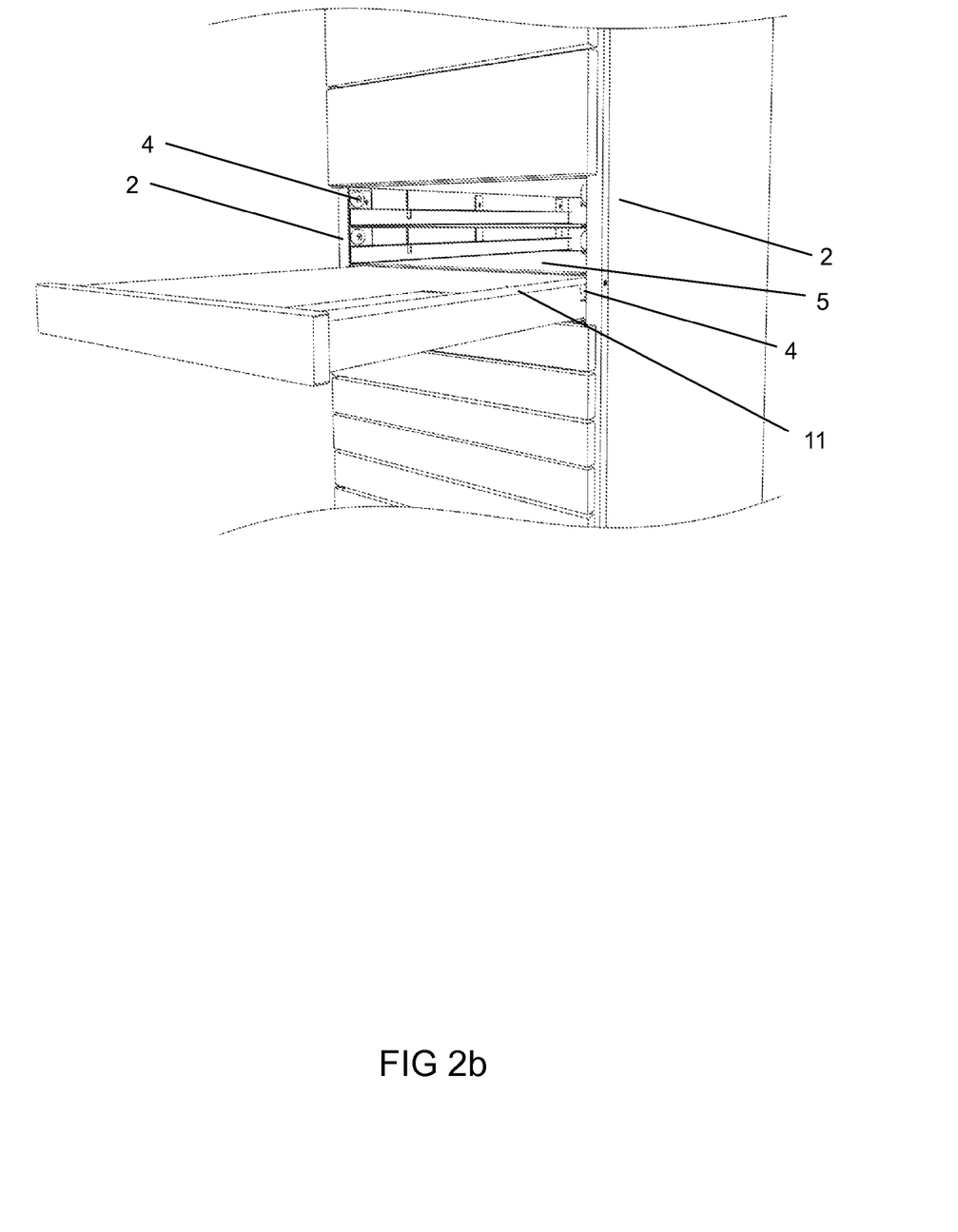
FIG. 2b shows a perspective view of the section of the module.
Figure 3:
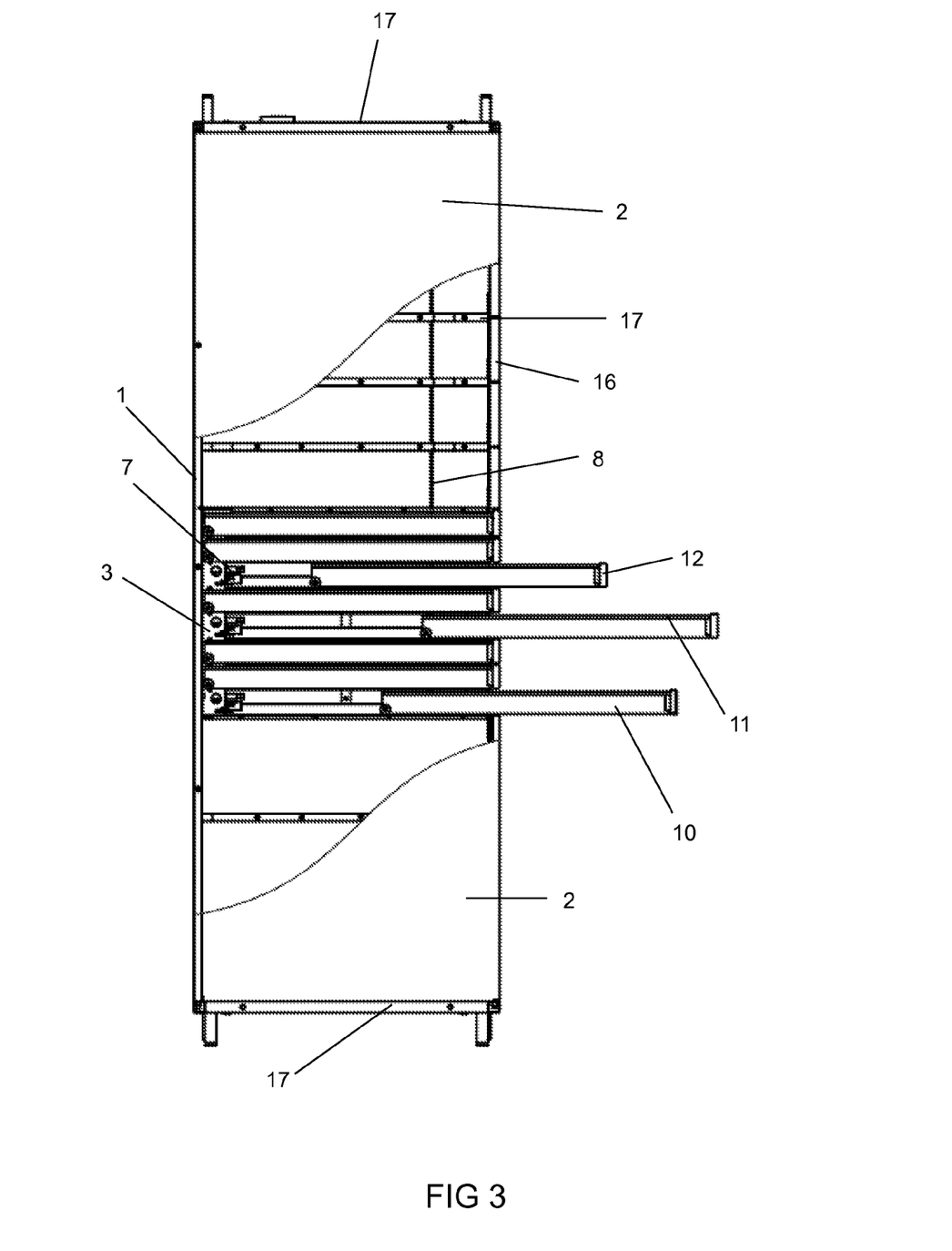
FIG. 3 shows a side view of the module.
Figure 4:
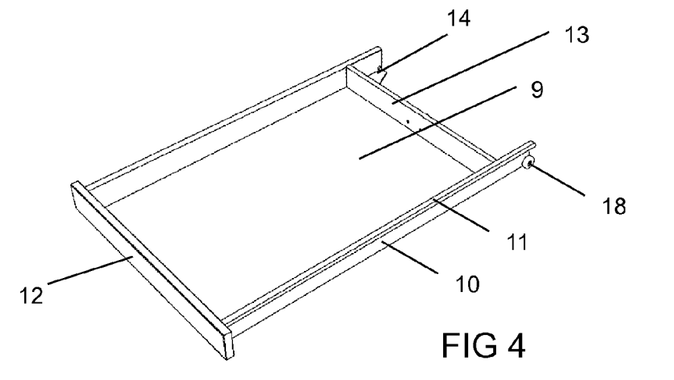
FIG. 4 shows a perspective view of the moving compartment.
Figure 5:
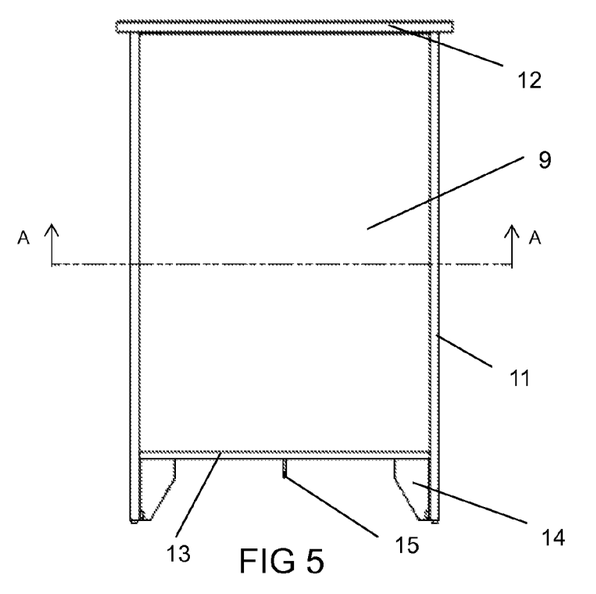
FIG. 5 shows a top view of the moving compartment.
Figure 6:
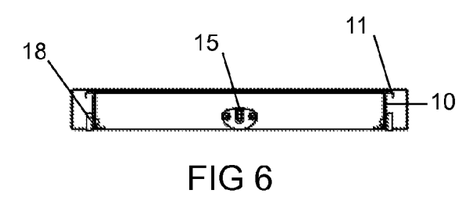
FIG. 6 shows the rear view of the moving compartment.
Figure 7:
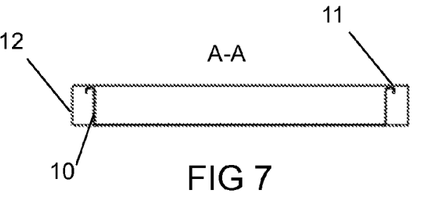
FIG. 7 shows the section A-A of the moving compartment in FIG. 5.

The drawing FIG. 2*a* shows a perspective view of the module of the modular parcel terminal and the drawing FIG. 3 showing a side view of the module depicts different positions of the outward moving compartment. The drawings FIG. 4 to FIG. 7 show a variety of views of the outward moving compartment.

Figure 8A:
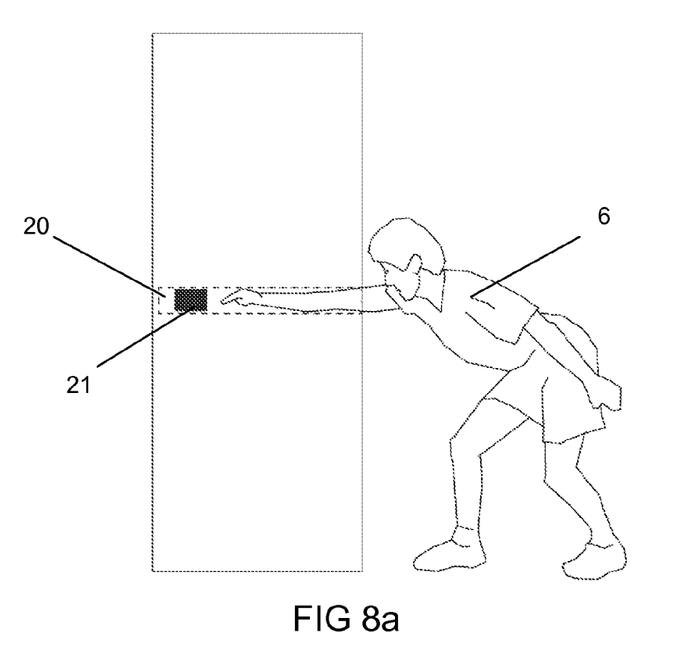
FIG. 8a depicts an example of retrieving a parcel from the parcel terminal in the case of known solutions.

The drawing FIG. 8*a* shows an example of retrieving a small parcel 21 from the parcel terminal in the case of known solutions where the user 6 has to push their hand deep into the parcel terminal to retrieve the small parcel 21 because the parcel 21 has slid to the rear part 20 of the parcel terminal.

Figure 8B:
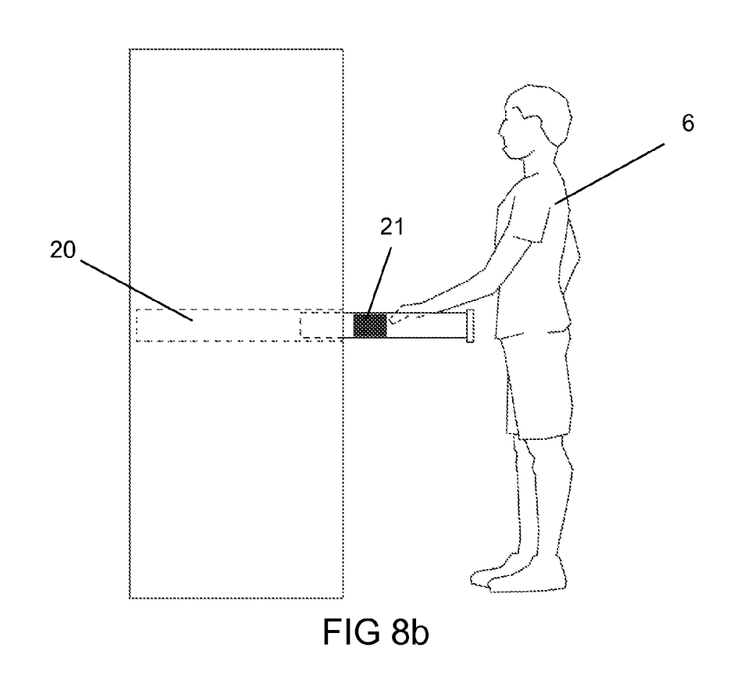
FIG. 8b depicts an example of retrieving a parcel from the parcel terminal moving compartment according to the present invention.

The example of retrieving a parcel 21 in the solution according to the present invention has been shown in the drawing FIG. 8b where retrieving the small parcel 21 that has slid to the rear part 20 of the parcel terminal upon the compartment moving out is simpler, more comfortable and safer for the user 6 because the user 6 does not have to make an effort to retrieve the small parcel 21 since they see precisely where the parcel is and can easily take it out because the outward moving compartment is open at the top.

The method for sending parcels according to the present invention covers the following stages:

The parcel is measured before entering it into the parcel terminal, and the measures are added to the parcel data;

If the measures of the parcel are small enough and the parcel does not need a high compartment, an outward moving compartment will be opened for entering the parcel;

The person entering the parcel can comfortably place the parcel in the compartment and push it closed together with the parcel;

Upon retrieving the parcel the compartment will move out again and the person retrieving the parcel can access the parcel comfortably as the compartment is open at the top;

After having retrieved the parcel, the open compartment is again pushed closed.

Compared to the lockers with doors used in the known solutions, the opening used for entering and retrieving the parcel is several times larger. That is why it is also easier to retrieve parcels that fit into the compartment tightly.

Outward moving compartments make retrieving parcels, especially from the compartments located in the upper and lower part of the parcel terminal, much more convenient compared to the known solutions because it is not necessary for the user to stretch their hand into the compartment.

In order to enter and retrieve a parcel the user will enter the parcel into a compartment with door of suitable size or into a movable compartment and will enter the recipient. If the same compartment has been assigned for retrieving the parcel, the recipient receives an electronic message (for example, SMS, e-mail, smart phone app, etc.) and upon coming to retrieve the parcel they enter the relevant code into user interface. Upon entering the code the compartment is opened for them to retrieve the parcel. If the parcel is to be retrieved at a parcel terminal at some other address, another user comes to pick up the parcels, for example, the courier, and enters their access code at the user interface (or identifies their access rights in some other way), picks up parcels from the assigned compartments and takes them to the next parcel terminal where they enter each parcel separately upon having received access to the terminal.

The invention claimed is:

1. A modular parcel terminal comprising a console module and a multitude of modules detachably connected to each other, each of said multitude of modules comprising:
 a rear panel;
 two side walls;
 a cable conduit;
 a multitude of compartments on top of each other, said compartments being either outward moving open-topped compartments separated from each other by horizontal partition panels and having a locking system, or compartments having a door with hinges and a locking device;
 wherein the outward moving open-top compartments comprise:
  a bottom, wherein the edges of the bottom have been bent into sides and edges of the sides have been bent into rails;
  a front panel;
  a rear panel;
  reinforcement panels; and
  a strike plate/receiver of the locking system fastened to the rear panel of the compartment regulating extent to which the compartment can be pulled out;
   said console module comprising electronics system for identifying a user of the terminal, placing orders, and making payments.

2. The modular parcel terminal according to claim 1, wherein support wheels are attached to the side walls of the module.

3. The modular parcel terminal according to claim 1, wherein rollers are attached to rear ends of the sides of the outward moving compartment.

4. The modular parcel terminal according to claim 1, wherein the compartment with a door comprises walls formed by the side walls of the module; a rear panel formed by the rear panel of the module; a door; and partition panels that form the bottom of upper sides of the compartment with door.

5. The modular parcel terminal according to claim 1, wherein the console module comprises moving compartments and one or more compartments with a door.

6. The modular parcel terminal according to claim 1, wherein support wheels have been attached to the side walls of the module.

7. The modular parcel terminal according to claim 6, wherein fastening places on side walls for the support wheels of rails of the outward moving compartments and for fastening partition panels for compartments with doors have been made at such spacing that the height of each compartment with door corresponds to the height of at least two outward moving compartments.

8. The modular parcel terminal according to claim 1, wherein rollers have been attached to the rear ends of the sides of the outward moving compartments.

9. A method for sending and receiving parcels, wherein the method comprises following stages:
 a) providing a modular parcel terminal comprising a multitude of modules detachably connected to each other and one of the modules being a console module, said modules comprising:
 a rear panel;
 two side walls;
 a cable conduit;
 a multitude of compartments on top of each other, said compartments being outward moving open-topped compartments separated from each other by horizontal partition panels and having a locking system;
 wherein the outward moving open-top compartments comprise:
  a bottom, wherein the edges of the bottom have been bent into sides and edges of the sides have been bent into rails;
  a front panel;
  a rear panel;
  reinforcement panels; and
  a strike plate/receiver of the locking system fastened to the rear panel of the compartment regulating extent to which the compartment can be pulled out;
   said console module further comprising electronics system for identifying a user of the terminal, placing orders and making payments:

b) measuring dimensions of a parcel and entering the measured dimensions into parcel data via the console module;
c) suitably sized outward moving open-topped compartment will be opened for entering the parcel;
d) placing the parcel into the open-topped moving compartment and pushing the compartment closed;
e) for retrieving a parcel, the compartment will move outward and the parcel will be taken out from said open-topped compartment; and after having retrieved the parcel, the empty compartment is pushed closed.

\* \* \* \* \*